United States Patent [19]
Matsubara

[11] Patent Number: 5,883,003
[45] Date of Patent: *Mar. 16, 1999

[54] METHOD FOR PRODUCING A SEMICONDUCTOR DEVICE COMPRISING A REFRACTORY METAL SILICIDE LAYER

[75] Inventor: Yoshihisa Matsubara, Tokyo, Japan

[73] Assignee: NEC Corporation, Tokyo, Japan

[21] Appl. No.: 428,673

[22] Filed: Apr. 25, 1995

[*] Notice: This patent issued on a continued prosecution application filed under 37 CFR 1.53(d), and is subject to the twenty year patent term provisions of 35 U.S.C. 154(a)(2).

[30] Foreign Application Priority Data

May 19, 1994 [JP] Japan .................. 6-128095

[51] Int. Cl.$^6$ .................................. H01L 21/324

[52] U.S. Cl. ................ 438/655; 438/656; 438/683

[58] Field of Search ........................ 437/200, 201, 437/248, 193; 457/192; 458/655, 656, 664, 683

[56] References Cited

U.S. PATENT DOCUMENTS

| | | | |
|---|---|---|---|
| 4,109,372 | 8/1978 | Geffken | 437/201 |
| 5,086,017 | 2/1992 | Lu | 437/200 |
| 5,180,689 | 1/1993 | Liu et al. | 437/187 |
| 5,217,922 | 6/1993 | Akasaki et al. | 437/183 |
| 5,231,038 | 7/1993 | Yamaguchi et al. | 437/200 |
| 5,240,880 | 8/1993 | Hindman et al. | 437/200 |
| 5,266,136 | 11/1993 | Nasr | 437/200 |
| 5,300,449 | 4/1994 | Okamura | 437/200 |
| 5,352,631 | 10/1994 | Sitaram et al. | 437/44 |
| 5,397,744 | 3/1995 | Sumi et al. | 437/200 |

FOREIGN PATENT DOCUMENTS 1-205446   8/1989   Japan .

OTHER PUBLICATIONS

M. Moslehi, "Single–Wafer Optical Processing of Semiconductors: Thin Insulator Growth for Integrated Electronic Device Applications", Appl. Phys. A, vol. 46, pp. 255–273, 1988.

Mallardeau et al, "Characterization of TiSi$_2$ Ohmic and Scholtky Contacts Formed by Rapid Thermal Annealing Technology", J. Electrochem. Soc., vol. 136, No. 1, Jan. 1989, pp. 238–241.

by M. Wittmer et al., "Oxidation kinetics of TiN thin films", Journal of Applied Physics, vol. 52, (11), Nov. 1981, pp. 6659–6664.

by T.P. Nolan et al., "Modeling of agglomeration of polycrystalline thin films: Applications to TiSi$_2$ on a silicon substrate", Journal of Applied Physics, vol. 71 (2), Jan. 1992, pp. 720–724.

by Tatsuya Yamazaki et al., "21 psec switching 0.1µm–CMOS at room temperature using high performance Co salicide process", IEDM 93, Japan.

Primary Examiner—John F. Niebling
Assistant Examiner—Ha Tran Nguyen
Attorney, Agent, or Firm—Young & Thompson

[57] ABSTRACT

A method for forming a low resistance refractory metal silicide film of a reduced film thickness is disclosed. The heat treatment temperature required for phase transition to lower the resistance of said silicide film is reduced by restricting the "removal" temperature at which the film is exposed to oxygen containing atmosphere following silicification heat treatment to a low temperature. By lamp annealing in an inert gas atmosphere or vacuum, and setting the removal temperature to less than or equal to 300° C., formation of excess oxygen containing layers are prevented leading to lower phase transition temperature. By lowering the phase transition temperature, the problem of film breakage or increase in resistance due to agglomeration is also prevented.

3 Claims, 10 Drawing Sheets

METHOD FOR PRODUCING A SEMICONDUCTOR DEVICE COMPRISING A REFRACTORY METAL SILICIDE LAYER

BACKGROUND OF THE INVENTION

1. Field of the Invention

The present invention relates to a method for producing a semiconductor device, and more specifically, to a method for forming a refractory metal silicide film on a silicon diffusion layer or a polysilicon gate electrode in a self-aligned manner.

2. Description of the Prior Art

The degree of integration of semiconductor devices is being continuously increased, and accordingly, the width of gate wiring (length of the gate electrode) and the width and thickness of the diffusion layer is being decreased. Decrease in the width of gate wiring and layer thickness inevitably results in increase in wiring resistance, causing the delay of circuit operations. In submicron semiconductor devices, the reduction of the resistance of refractory metal silicide is an important and essential technology.

In MOS semiconductor devices, the self aligned silicide technique using titanium (Ti) as a refractory metal is being successfully applied to actual devices.

In this kind of structure of transistors, however, the diffusion layer is being forced to become a shallow junction due to the trend towards increased integration. Thus, a reduced thickness of the silicide film is being demanded. The reduction of the silicide film thickness causes not only increase in sheet resistance due to the reduction of the film thickness itself, but also the following two problems on the formation of the silicide film: Firstly, the problem of the breaking (electrical disconnection) of or increase in resistance of the silicide due to agglomeration, and secondly, the problem of rise in phase transition temperature.

The cause of the breaking of the titanium silicide layer due to agglomeration is considered as follows. Titanium silicide films begin to soften at a temperature of 800° C. or above, and becomes flowable. This flow occurs in the horizontal direction on the surface of the titanium silicide or at the interface with the diffusion layer. By this flow, the titanium silicide film deforms to minimize its surface energy. That is, the film separates into a thick island region and a thin film region. Due to this phenomenon, the uniformity of the titanium silicide film thickness is lost, and in some cases, the film is completely broken, i.e. disconnected electrically. The conductivity of the titanium silicide is therefore deteriorated, and resistance increases.

Furthermore, decrease in silicide film thickness and decrease in silicide wiring width both cause increase in surface tension. This results in decrease in the temperature at which agglomeration begins. This was reported by T. P. Nolan, et al. in Journal of Applied Physics, 71 (2), p. 720 (1992).

On the other hand, phase transition is required for forming a titanium silicide film. This is the phase transition from the C49 structure, which is a non-equilibrium phase having a high sheet resistance (resistivity: $2\times10^{-4}$ $\Omega$cm), to the C54 structure having a low sheet resistance (resistivity: $1.5\times10^{-5}$ $\Omega$cm). In order to reduce the size of transistors, increase in impurity concentration, decrease in the silicide film thickness, and decrease in the silicide film width are required. The phase transition temperature varies depending on these impurity concentration, silicide film thickness and silicide film width. By reducing the silicide film thickness from 50 nm to 30 nm, for example, the phase transition temperature from the C49 structure to the C54 structure increases from about 700° C. to 900° C. or above.

Conventional silicides are therefore formed only in the temperature range limited by phase transition temperature and agglomeration temperature, i.e., above the phase transition temperature and below the agglomeration temperature. Because of the rise in phase transition temperature and decrease in agglomeration temperature due to the above reduction of the device size, the temperature range in which suicides are formed satisfactorily is disappearing, and in the design of a device of 0.5 $\mu$m or below, a film of low resistivity (10 $\Omega/\square$) can no longer be obtained by conventional silicide formation methods.

The prior art method for producing a transistor having a conventional structure will be described referring to FIGS. 1 and 2. FIG. 1(a)–FIG. 1(d) and FIG. 2(a)–FIG. 2(c) are sectional views illustrating the steps of the first embodiment of the conventional method for producing this type of transistors.

Figure 1A:
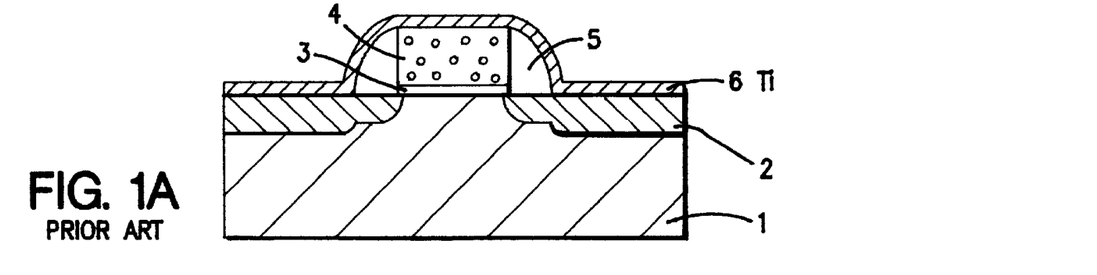
FIG. 1(a)–FIG. 1(d) are sectional views illustrating the steps of the method for producing the first embodiment of prior art.
Figure 2A:
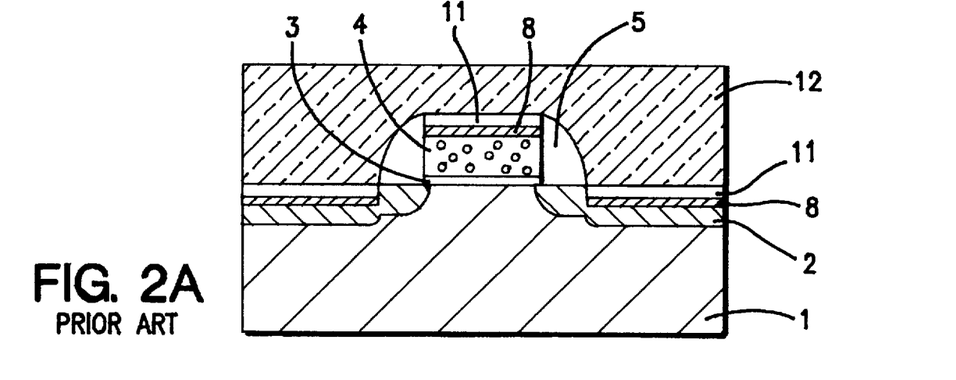
FIG. 2(a)–FIG. 2(c) are sectional views following FIG. 1 illustrating the steps of the method for producing the first embodiment of prior art.
Figure 2B:
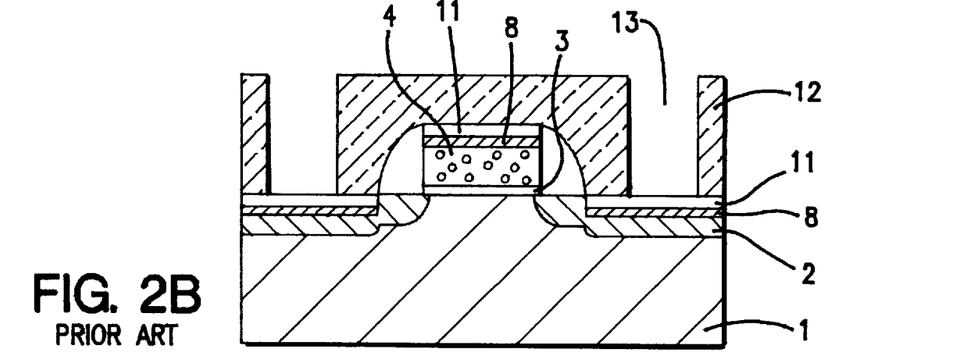
Figure 2C:
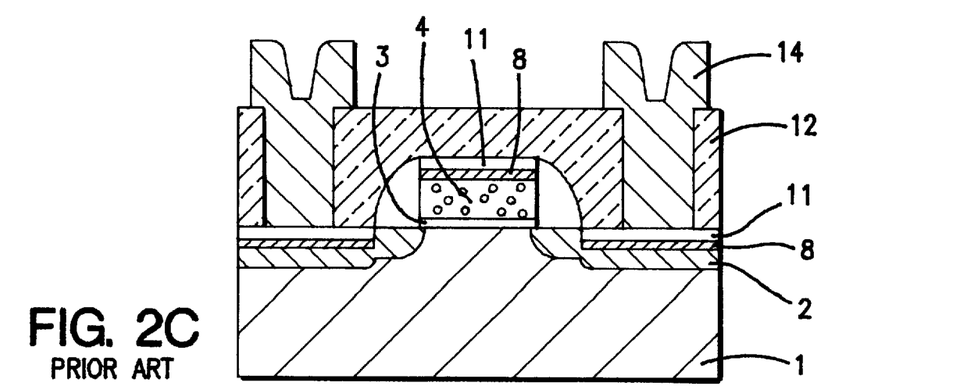

First, as shown in FIG. 1(a), on a silicon substrate 1, a gate electrode 4 consisting of polysilicon is formed on a gate oxide film 3; a part of a diffusion layer 2 is formed using the gate electrode 4 as a mask, a side wall 5 adjacent to the gate electrode is formed, and then a part of a diffusion layer is further formed, to form the diffusion layer 2 of a Lightly Doped Drain (LDD) structure in the surface region of the silicon substrate 1. Thereafter, a titanium film 6 of a desired film thickness (10–100 nm) is formed on the entire surface by sputtering.

Figure 1B:
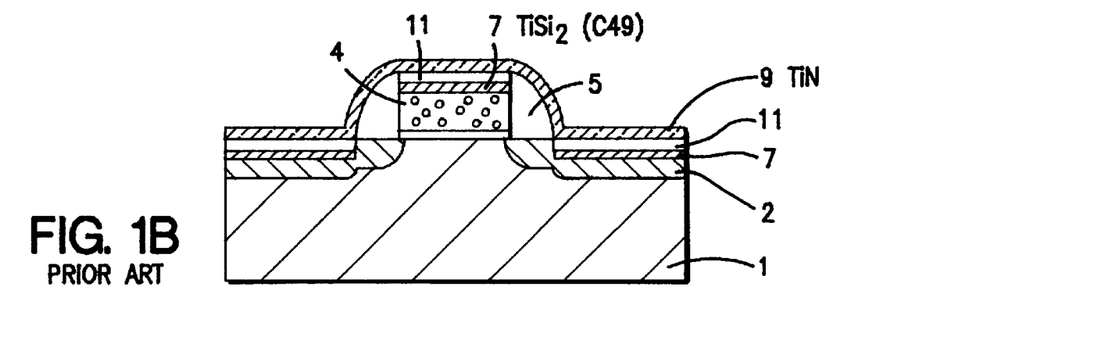

Next, heat treatment for forming the silicide is performed for 30–60 seconds in a nitrogen atmosphere at 600°–700° C. For this heat treatment, a heat treatment chamber equipped with a lamp annealing device is usually used. By this, as shown in FIG. 1(b), a titanium silicide (TiSi$_2$) film 7 of the C49 structure is formed in a region where the titanium film 6 contacts with the silicon surface, that is, the region on the surface of the gate electrode 4 and the surface of the diffusion layer 2 not covered by the insulation film. The titanium film 6 on the silicon oxide film (e.g. on the side wall 5) and the titanium film not silicified react with nitrogen to form a titanium nitride (TiN) film 9.

After the heat treatment, the wafer is removed from the heat treatment chamber. The removal is performed at a temperature of 400°–500° C. at which silicon is not oxidized. At this time, the titanium nitride film 9 absorbs approximately 30 percent oxygen, which is the dissolution limit of oxygen in TiN, and becomes partly oxidized. The oxygen which has passed through the partially oxidized titanium nitride film reaches the surface of the titanium silicide film 7 and oxidizes a part of the surface to form an oxygen excess silicide film 11 of a thickness of about 15 nm at the interface between the titanium silicide film 7 and the titanium nitride film 9.

Figure 1C:
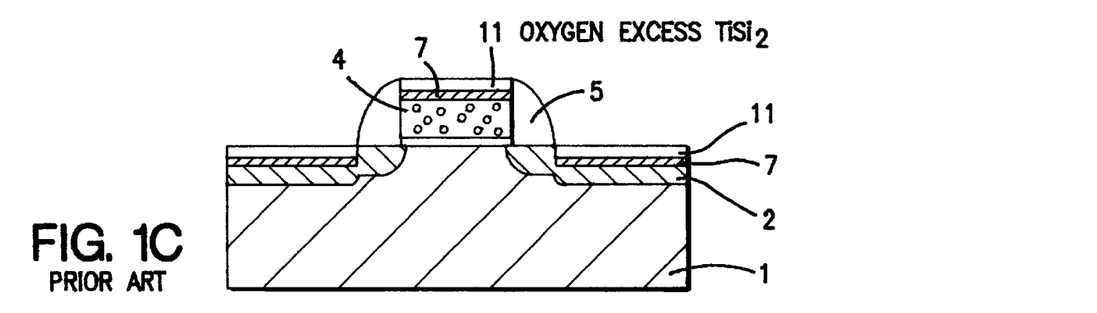

Next, as shown in FIG. 1(c), the titanium nitride film 9 and the titanium film which has not reacted are removed using a mixed solution of ammonia water and hydrogen peroxide. By the above steps, a self-aligned titanium silicide film 7 is formed on the gate electrode 4 and the diffusion layer 2 forming the source and drain regions.

Figure 1D:
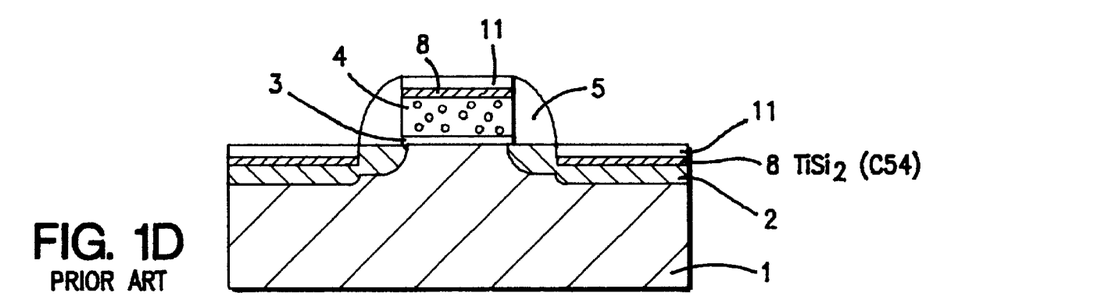

Thereafter, as shown in FIG. 1(d), a second heat treatment for phase transition is performed in a nitrogen atmosphere at about 800° C. for about 60 seconds to form a titanium silicide (TiSi$_2$) film 8 having the C54 structure, the resistivity of which is lower than the resistivity of the C49 structure. Next, as shown in FIG. 2(a), an interlayer insulation layer 12 consisting of SiO$_2$ is formed using the ordinary chemical vapor deposition (CVD) process. Here, heat treatment is performed at about 600° C., which is the vitrification temperature of $SiO_2$, to remove moisture in the interlayer insulation film, and to allow the interlayer film to reflow thereby improving flatness. Next, as shown in FIG. 2(b), the interlayer insulating film 12 is selectively removed using the normally used lithography and etching to form a contact hole 13 reaching the diffusion layer 2. Finally, as shown in FIG. 2(c), the deposition and patterning of aluminum are performed to form the electrode/wiring 14, thus producing a desired semiconductor device.

Furthermore, as the second embodiment of the prior art method for producing this type of transistors, the method disclosed in JPUPA 1-205446 and IEEE International Electron Device Meeting, p. 906 (1993) will be described referring to FIG. 3. In this second embodiment also, like the first embodiment shown in FIG. 1(a), on a silicon substrate 1, a gate oxide film 3, a gate electrode 4 consisting of polysilicon and adjacent side walls 5 are formed. A diffusion layer 2 of the LDD structure is formed in the surface region of the silicon substrate 1. Next, a titanium film 6 of a desired thickness (10–100 nm) is formed on the entire surface by sputtering. Then a titanium nitride film 9a is formed by nitrogen atmosphere heat treatment, after which the wafer is taken out from the heat treatment chamber into atmosphere. For the following steps, the same steps as in the first embodiment shown in FIG. 1(b) and later, are performed to form titanium silicide on the gate electrode 4 and the diffusion layer 2.

SUMMARY OF THE INVENTION

In the prior art described above, the sheet resistance of the entire silicide increases steeply when the silicide film thickness is reduced to 70 nm or below. The reason for this behaviour is considered as follows:

(1) In the prior art, an oxygen excess silicide film 11 of a high resistance is formed on the titanium silicide 8. Thus, the effective film thickness decreases and resistance increases significantly when the thickness of the titanium silicide film decreases, because the thickness of the oxygen excess silicide film 11 is almost constant regardless of the thickness of the titanium silicide film 8.

(2) In prior art embodiments, in which the oxygen concentration in the silicide film is high, the diffusion of titanium and silicon during heat treatment for the phase transition of the silicide film is inhibited by incorporated oxygen. Thus the phase transition temperature rises, and sufficient phase transition cannot be performed due to temperature limits associated with agglomeration, resulting in increase in sheet resistance.

Figure 3:
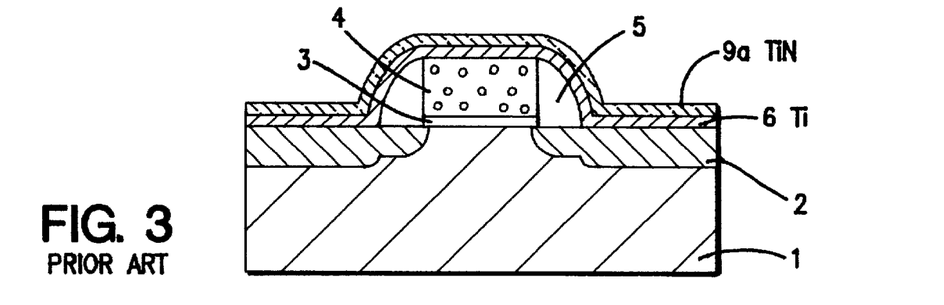
FIG. 3 is a sectional view illustrating the method for producing the second embodiment of, prior art.

Such a tendency is also found in the second embodiment of the prior art shown in FIG. 3. As described above, since titanium nitride is easily oxidized, and the permeability of oxygen is high, the formation of an oxygen excess silicide film on the titanium silicide film cannot be prevented. Such oxidation property and oxygen diffusion property of titanium nitride are described in the Journal of, Applied Physics, 52 (11), p. 6659 (1981).

It is an object of the present invention to minimize the formation of an oxygen excess silicide film on the silicide film. It is another object of the present invention to make the concentration of oxygen diffused in the silicide film as low as possible. By achieving the above objects, decrease in the effective thickness of the silicide film is prevented, the phase transition temperature is lowered to widen the process window, and the silicide film of a low resistance is formed reproducibly.

For achieving the above objects, the present invention provides a method for producing a semiconductor device comprising the steps of (1) forming a refractory metal film 6 on a semiconductor substrate having a diffusion layer 2 the surface of which is exposed and/or a polysilicon layer 4 the surface of which is exposed, and (2) forming a refractory metal silicide layer 7 on said diffusion layer and/or said polysilicon layer by heating to allow the refractory metal to react with silicon, wherein the temperature at which said semiconductor substrate is removed from the heat treatment chamber after the above step (2) and exposed to atmosphere containing oxygen is set at 300° C. or below.

In the present invention, the removal of the wafer after heat treatment for silicification, that is the exposure of the wafer having a silicide film on the surface or having a surface coated with titanium or titanium nitride to an oxygen-containing atmosphere is performed at a temperature of 300° C. or below. Even if the silicide is exposed on the surface, the surface is little oxidized at this temperature. In cases such that the surface is coated with a titanium film or a titanium nitride film, since these films are little oxidized at such a low temperature, and since the permeability of oxygen is low, the supply of oxygen to the surface of the silicide film is inhibited, thereby preventing the oxidation of the film. Therefore, since decrease in the effective thickness of the film is inhibited, and no oxygen is supplied to the silicide film, phase transition is performed at a low temperature, preventing the shrinkage of the process window. As a result, a silicide film having a low resistance can be formed reproducibly.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

The preferred embodiments of the present invention will be described referring to the drawings.

EXAMPLE 1

The method for producing the first embodiment of the present invention will be described referring to FIG. 4(a)–FIG. 4(d) and FIG. 5(a)–FIG. 5(c).

Figure 4A:
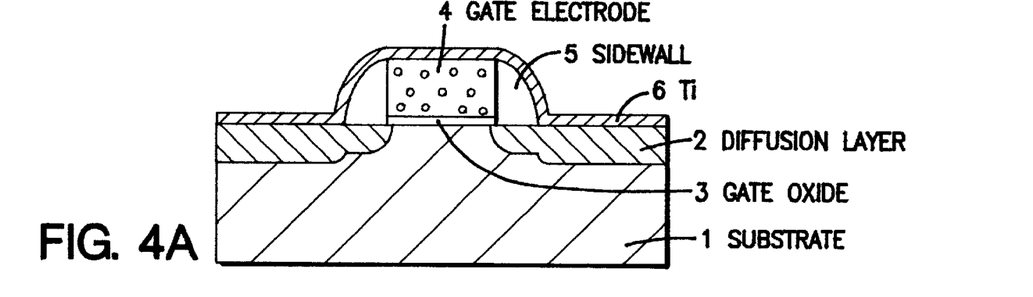
FIG. 4(a)–FIG. 4(d) are sectional views illustrating the steps of the method for producing the first embodiment of the present invention.

As FIG. 4(a) shows, a gate oxide film 3, a gate electrode 4 consisting of polysilicon, and a side wall 5 consisting of a silicon oxide film are formed on a silicon substrate 1, and a diffusion layer 2 of an LDD structure is formed in the surface region of the silicon substrate 1 in the same manner as in the prior art embodiments. Next, a titanium film 6 of a desired thickness (10–100 nm) is formed on the entire surface by sputtering.

Figure 6:
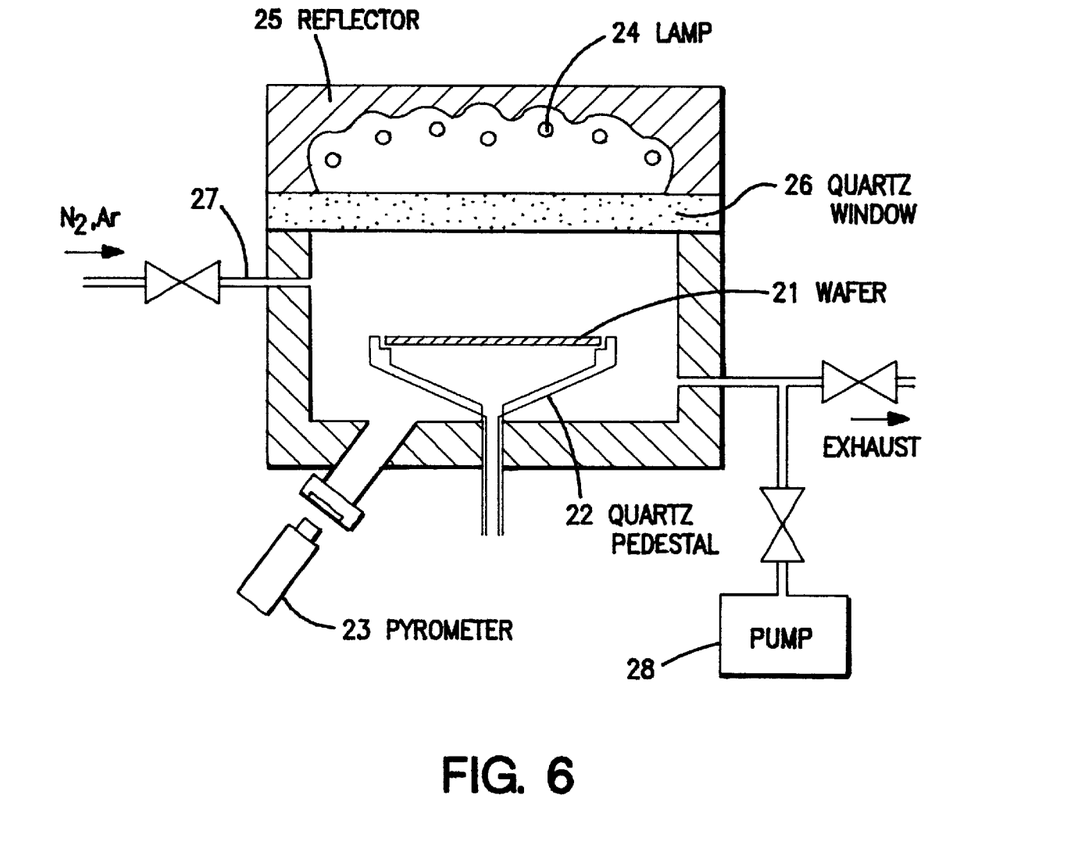
FIG. 6 depicts the heat treatment chamber used in the present invention.

Next, the wafer is annealed in a heat treatment chamber equipped with a lamp annealing device as shown in FIG. 6. The wafer 21 is placed on a quartz pedestal 22. Wafer temperature is monitored using a pyrometer 23. Infrared light emitted from tungsten halogen lamps 24 and reflected by a reflector 25 passes through a quartz window 26 to illuminate the wafer surface. The chamber can be either filled with nitrogen gas (or other inert gases) through a gas inlet 27, or evacuated to a desired vacuum pressure by a vacuum pump 28 so as to prevent oxidation of the wafer. In the present embodiment, annealing is performed for 30–60 seconds at a temperature of 600°–700° C. in a nitrogen atmosphere. At this stage, a titanium silicide film 7 having a high layer resistance is formed in the region where the titanium film 6 is in contact with the silicon surface, that is, the region of the surface of the gate electrode 4 and the surface of the diffusion layer 2 not covered with an insulation film. The silicon film 6 on the silicon oxide film and the titanium film on the silicon not silicified react with nitrogen to form a titanium nitride film 9.

Figure 4B:
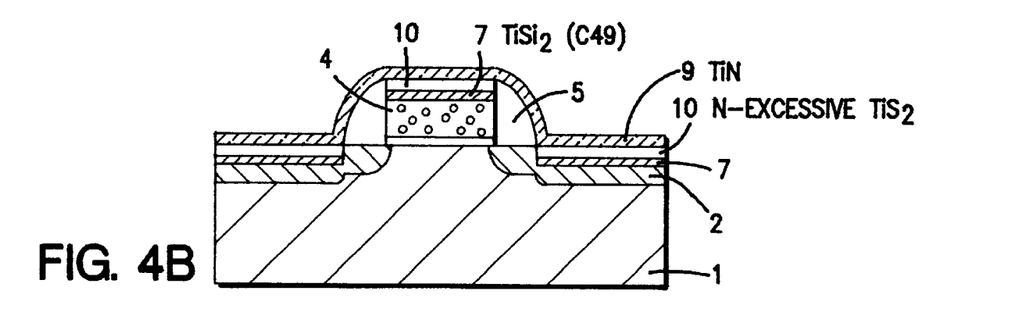

During this heat treatment, nitrogen is incorporated into the silicide film to form a nitrogen excess silicide film 10. After the completion of heat treatment, the wafer is removed from the heat treatment chamber at a temperature of 300° C. or below and exposed to atmosphere. By removing the wafer at a relatively low temperature, the titanium nitride film 9 acts as a barrier to oxygen. Further, since the oxygen incorporating capacity of the silicide film decreases, the formation of an oxygen excess silicide 11 on the silicide film is prevented even when exposed to atmosphere.

Figure 4C:
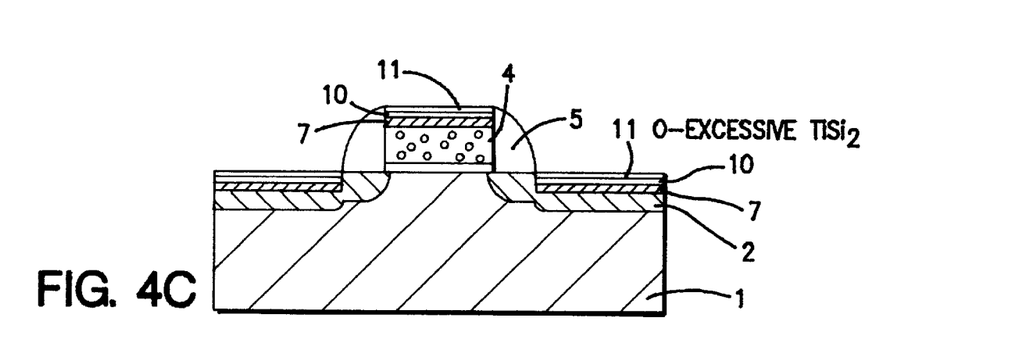
Figure 4D:
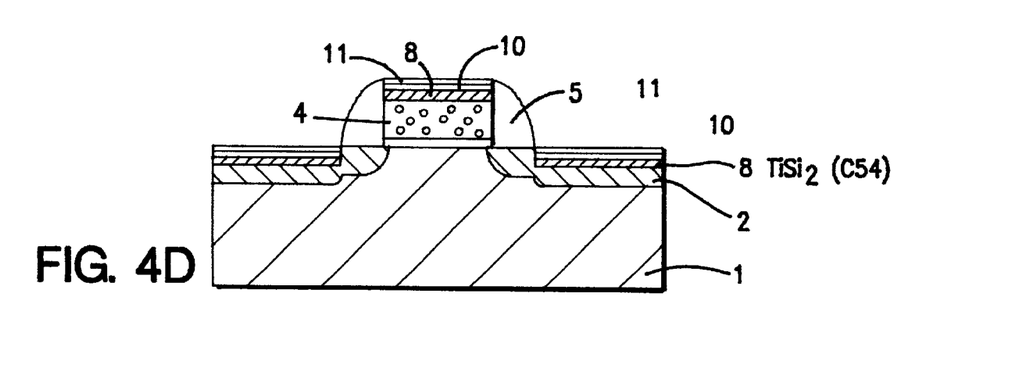

Next, as FIG. 4(c) shows, the titanium nitride film 9 and the titanium film 6 which has not reacted are removed using a mixed solution of ammonia water and hydrogen peroxide. At this time, oxygen contained in the air is adsorbed on the silicide to form an oxygen excess silicide film 11 of a thickness of 3 nm on the surface of the silicide. Next, as FIG. 4(d) shows, a second heat treatment required for phase transition from the C49 structure to the C54 structure is performed using the heat treatment chamber. By heat treatment conditions of 800°–900° C. for about 30 seconds, a titanium silicide film 8 of the C54 structure with a low resistance is formed. After the completion of heat treatment, the wafer is removed from the heat treatment chamber at a temperature of 300° C. or below.

Figure 7:
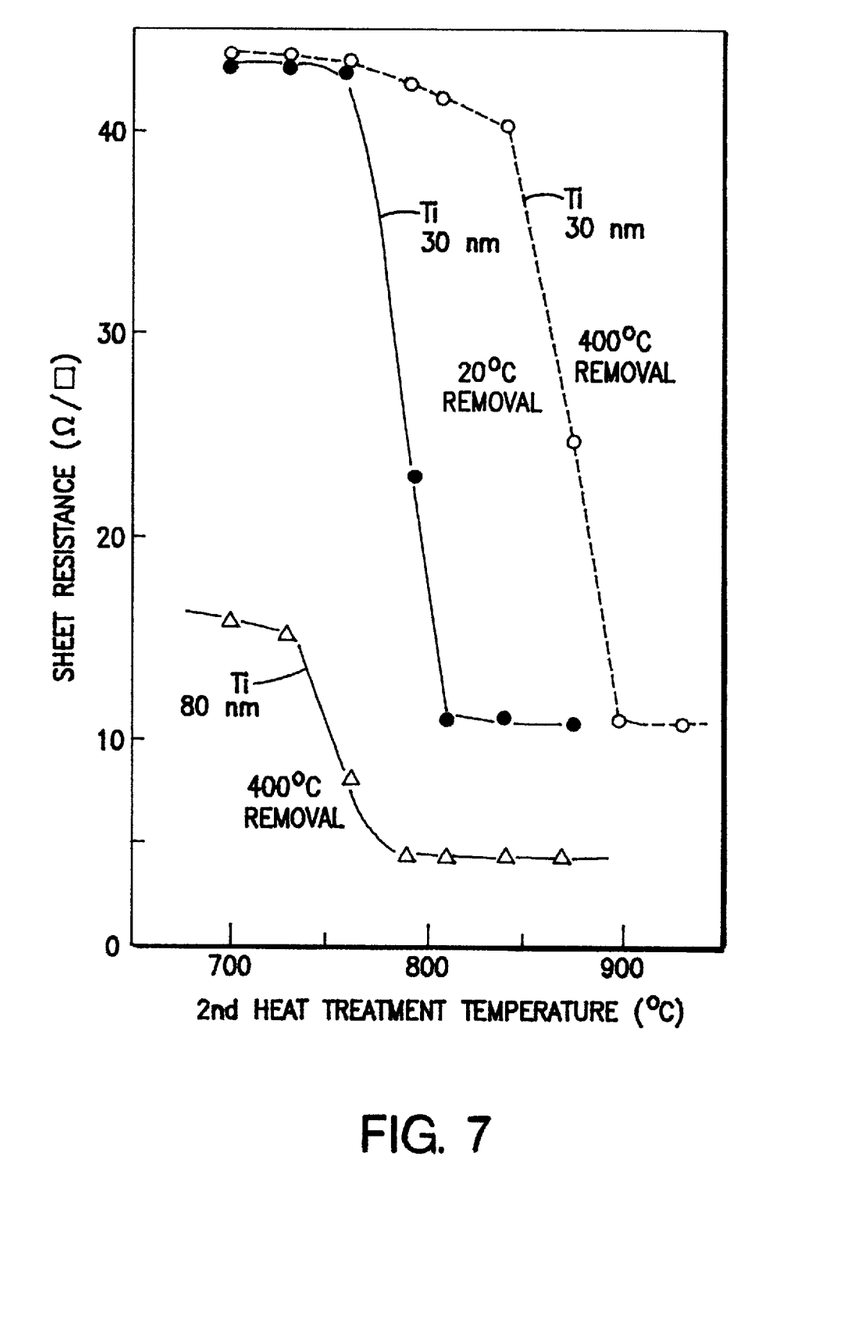
FIG. 7 is a graph illustrating the effect of the first embodiment of the present invention.

FIG. 7 shows the removal temperature dependence in the first heat treatment of phase transition temperature from the C49 structure to C54 structure. When the thickness of the titanium film is 30 nm and the removal temperature is 400° C., the phase transition temperature is 900° C. or above, while by setting the removal temperature to a room temperature of 20° C., the phase transition temperature is lowered to about 800° C., which is almost the same as the phase transition temperature when the thickness of the titanium film 6 is 80 nm. Thus, the problem of the narrow process margin due to rise in the phase transition temperature is solved.

Figure 8:
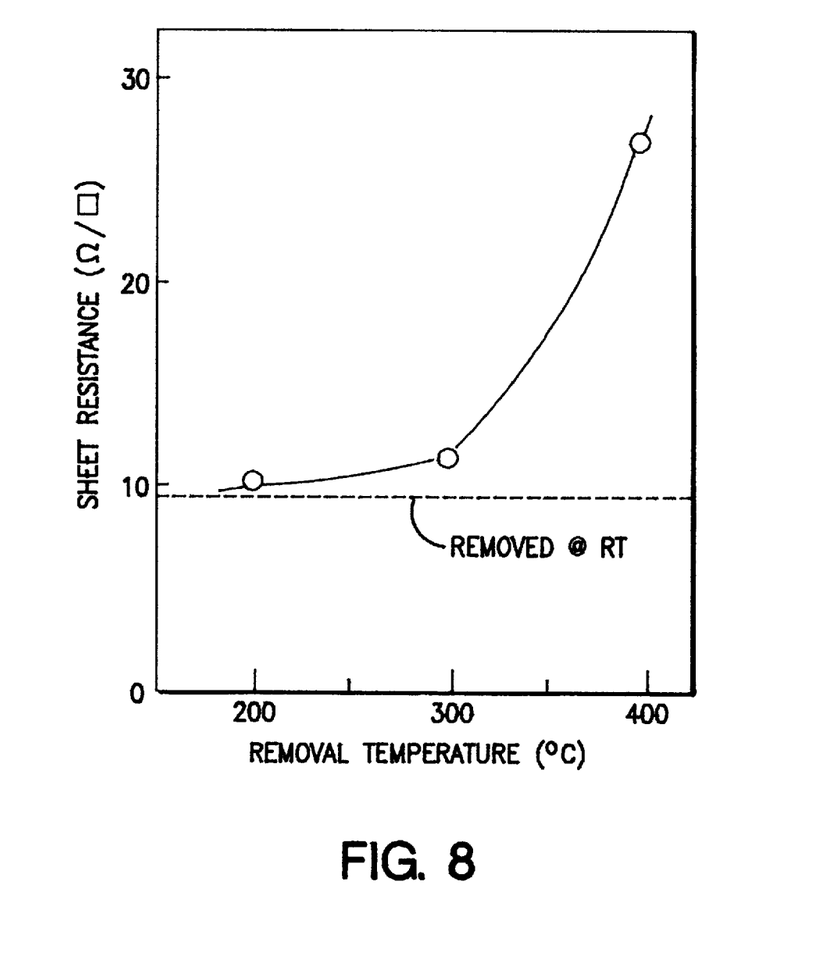
FIG. 8 is a graph illustrating the effect of the first embodiment of the present invention.

FIG. 8 shows the first heat treatment-removal temperature dependence of the resistance of the silicide layer. When the removal temperature is 300° C. or above, the sheet resistance increases sharply due to increase in the thickness of the oxygen excess silicide film and increase in oxygen content. By setting the removal temperature to 300° C. or below, however, sheet resistance values almost the same as that obtained by room temperature removal is achieved.

The removal temperature dependence of sheet resistance was measured for different wafer removal temperatures after the heat treatment for phase transition (second heat treatment). Almost the same results as the removal temperature dependence after the first heat treatment shown in FIG. 8 were obtained.

Figure 5A:
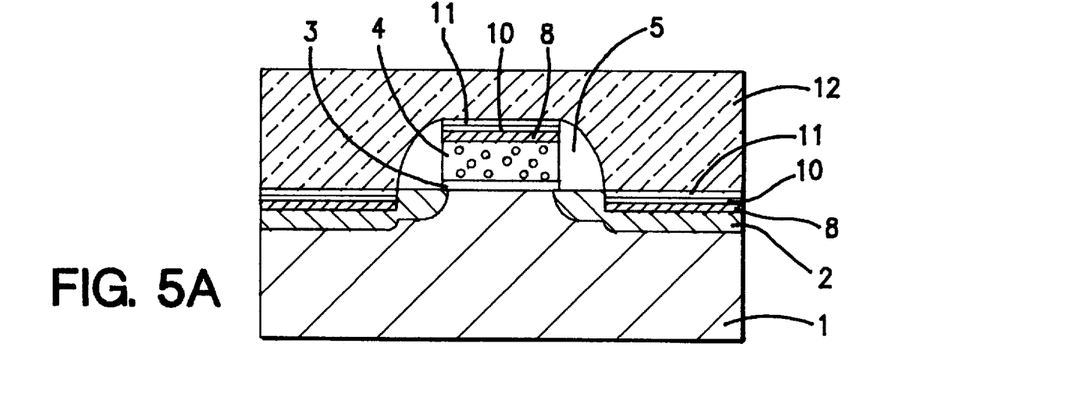
FIG. 5(a)–FIG. 5(c) are sectional views following FIG. 4 illustrating the steps of the method for producing the first embodiment of the present invention.

Next, as shown in FIG. 5(a), an interlayer insulation film 12 consisting of a silicon oxide film containing boron and phosphorus of a thickness of about 600 nm was grown using the CVD method. After the formation of this interlayer insulation film, heat treatment for vitrification is performed at about 800° C. using a lamp annealing device. In this heat treatment also, annealing is done in a nitrogen atmosphere and the wafer removal temperature is set at 300° C. or below.

Figure 5B:
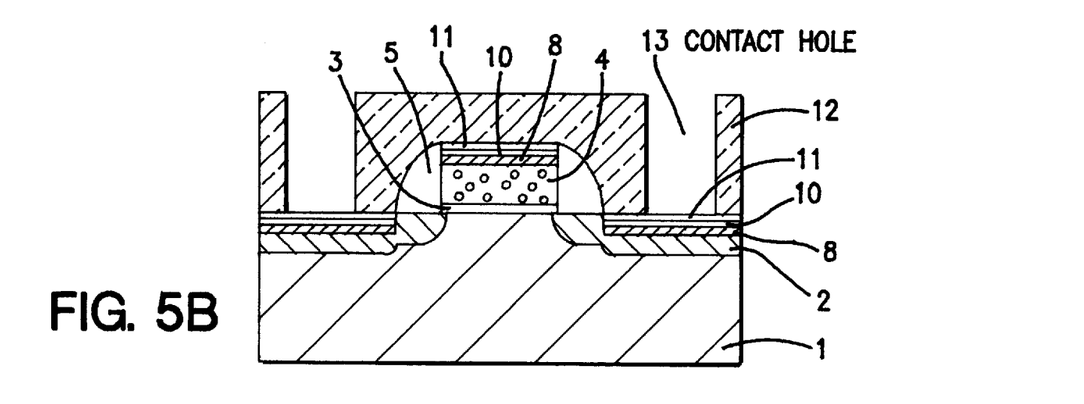
Figure 5C:
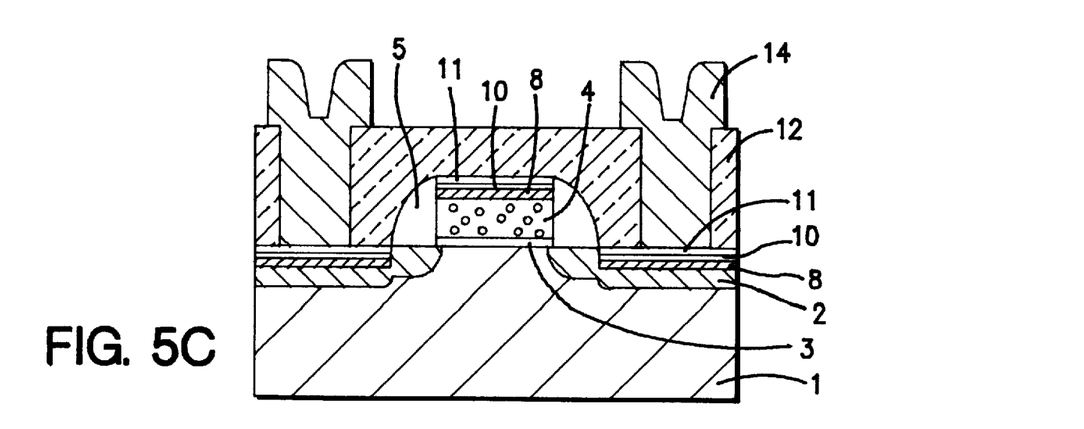

Next, as shown in FIG. 5(b), a contact hole 13 is opened at the desired location in the interlayer insulation film 12. Then as shown in FIG. 5(c), an electrode/wiring 14 consisting of aluminum is formed. Also in the process for forming an aluminum film used as the electrode/wiring 14, the technique for improving the step coverage of the aluminum film by heat treatment during film formation is available. In such a process also, the wafer removal temperature is set at 300° C. or below to prevent increase in the oxygen content in the silicide.

EXAMPLE 2

Figure 9A:
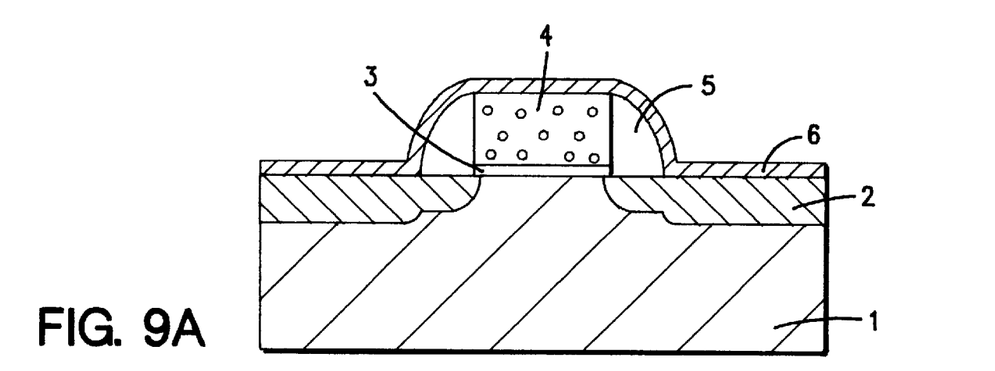
FIG. 9(a)–FIG. 9(c) are sectional views illustrating the steps of the method for producing the second embodiment of the present invention.
Figure 9B:
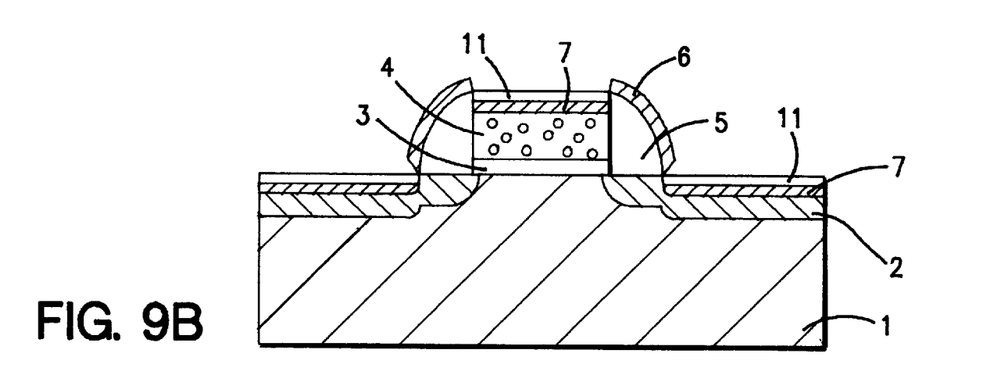
Figure 9C:
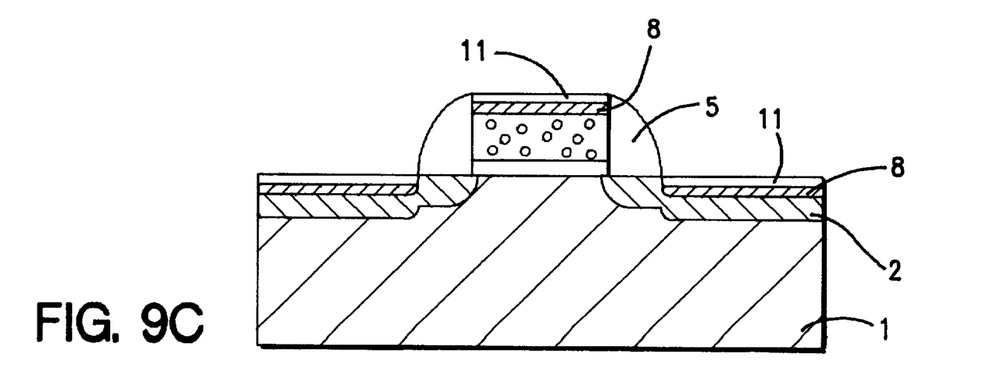

FIG. 9(a)–FIG. 9(c) show sectional views of a semiconductor device illustrating the steps for producing the second embodiment of the present invention. In this embodiment, two heat treatment steps for forming the silicide film are performed in vacuum.

As FIG. 9(a) shows, in the same manner as in the first embodiment shown in FIG. 4(a), after a transistor of the LDD structure is formed, a titanium film 6 of a desired thickness (10–100 nm) is formed on the entire surface by sputtering.

Next, heat treatment is performed in vacuum at 600°–700° C. for 30–60 seconds. By this, as shown in FIG. 9(b), a titanium silicide film 7 with a high sheet resistance is formed on the surface of the titanium 6 in contact with the silicon surface, that is, the region of the surface of the gate electrode 4 and the surface of the diffusion layer 2 not covered with the insulation film, leaving unreacted titanium film 6 on the sidewall silicon oxide film 5.

Since this first heat treatment is performed in vacuum, nitrogen is not incorporated in the silicide, and the titanium nitride film 9 and the nitrogen excess silicide 10 are not formed. After the completion of heat treatment, the wafer is removed from the chamber at a temperature of 300° C. or below. By this, an oxygen excess silicide film 11 of a thickness of about 6 nm is formed.

Next, as FIG. 9(c) shows, the free titanium film 6 is removed using a mixed solution of ammonia water and hydrogen peroxide. Then, heat treatment is again performed in vacuum at 800° C. to convert the titanium silicide film 7 of the C49 structure into the titanium silicide film 8 of the C54 structure. The wafer is then removed from the chamber at a temperature of 300° C. or below. The following steps are the same as in the first embodiment shown in FIG. 2(a)–FIG. 2(c).

Figure 10:
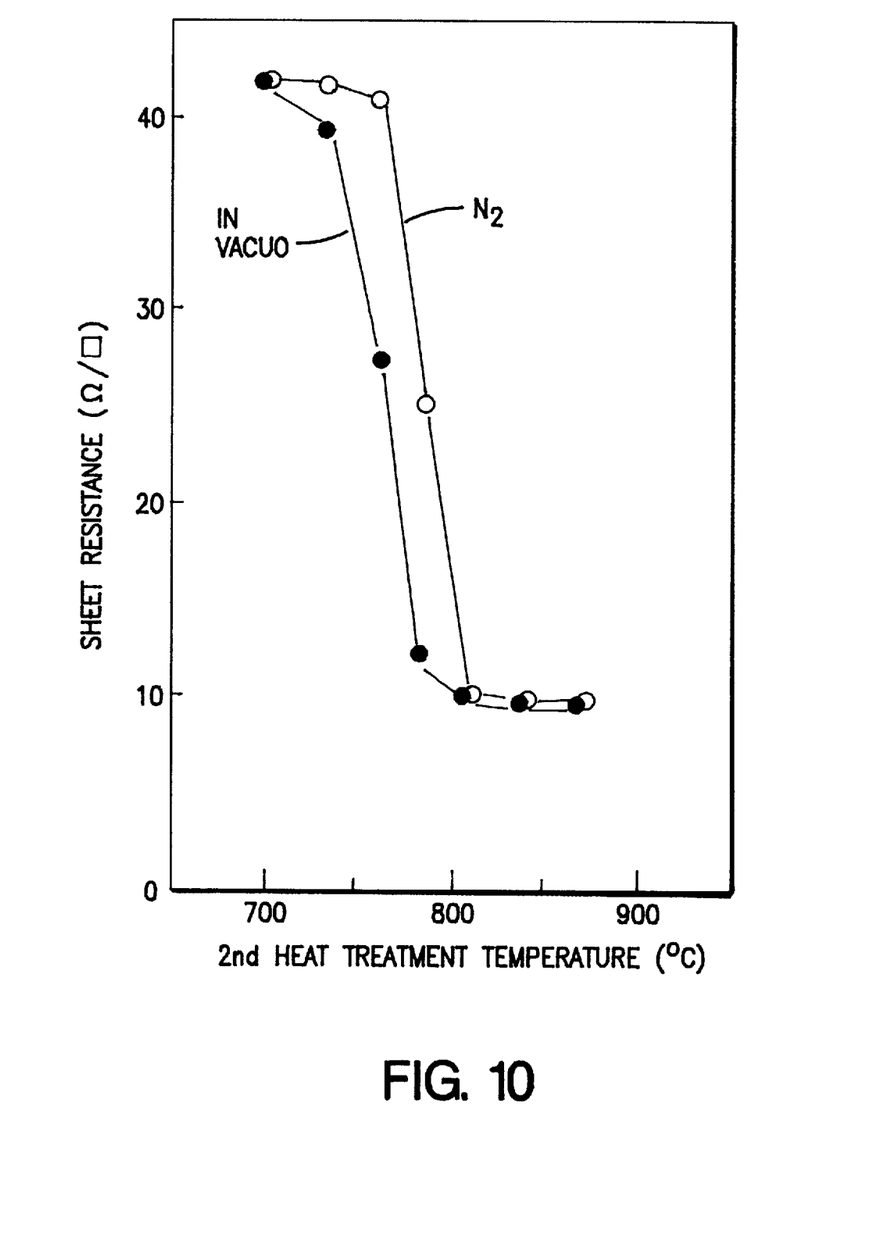
FIG. 10 is a graph illustrating the effect of the second embodiment of the present invention.

FIG. 10 shows the second heat treatment temperature dependence of sheet resistance when the first heat treatment was performed in vacuum (the second embodiment) or in a nitrogen atmosphere (the first embodiment). In the second embodiment, nitrogen is not incorporated in silicide because silicification is performed in vacuum, and nitrogen excess silicide 10 is not formed. As the result, a thicker titanium silicide film 8 is formed than in the first embodiment, whereby the phase transition temperature can be lowered by about 30° C., and the process window can be expanded.

EXAMPLE 3

Figure 11A:
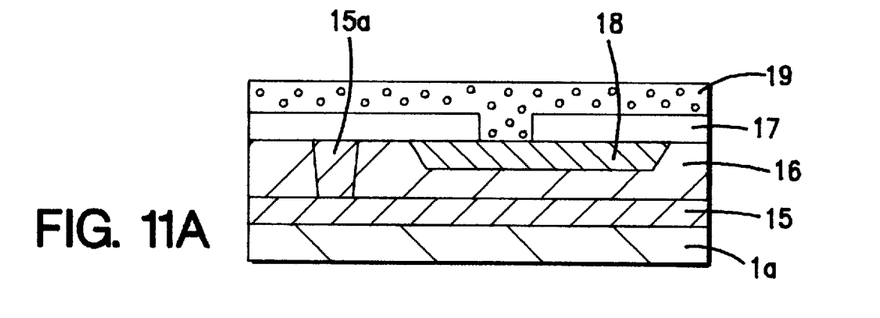
FIG. 11(a)–FIG. 11(c) are sectional views illustrating the steps of the method for producing the second embodiment of the present invention.
Figure 11B:
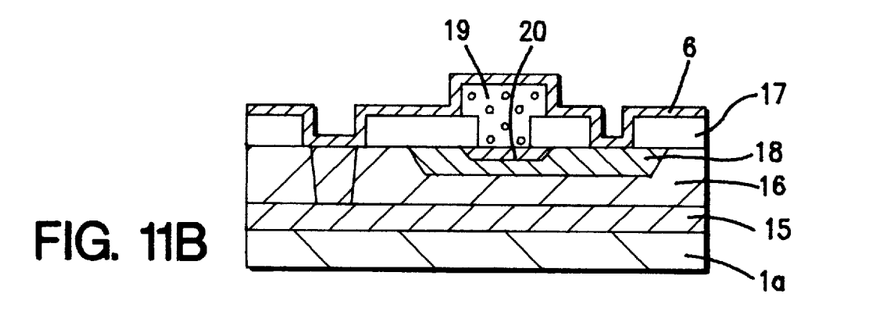
Figure 11C:
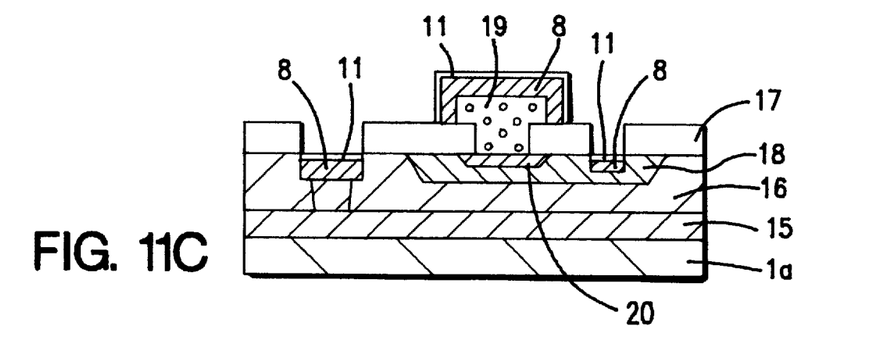

FIG. 11(a)–FIG. 11(c) shows the sectional views of a semiconductor device illustrating the third embodiment of the present invention, which is an example where the present invention is applied to a bipolar transistor.

First, as FIG. 11(a) shows, an N-type embedded layer 15 is formed in the surface region of a P-type silicon substrate 1a by the diffusion of arsenic atoms. Next, an N-type epitaxial layer 16 is formed, and then an embedded collector draw-out region 15a is formed by the selective diffusion of phosphorus atoms.

Next, a silicon oxide film 17 is formed over the entire surface, and boron atoms are ion-implanted to form a base region 18. After the silicon oxide layer 17 is selectively etched off to form an opening on the base region 18, a polysilicon film 19 of a thickness of 70°–100 nm is deposited over the entire surface by the CVD method.

Next, arsenic atoms are implanted from the top of the polysilicon film 19 by an ion-implantation energy of 70–80 keV. As a result, the maximum of the arsenic atom concentration is located at almost the middle of the thickness of the polysilicon film 19.

Next, as FIG. 11(b) shows, lamp annealing is performed at a temperature of 900°–1100° C. for activation of boron and arsenic atoms, whereby the arsenic atoms are diffused from the polysilicon film 19 to the base region 18 to form an emitter region 20. After the polysilicon film 19 is selectively etched off, the silicon oxide film 17 is selectively etched to form an opening having a depth reaching the collector draw-out region 15a and the base region 18. Next, titanium film 6 of a thickness of 10–60 nm is deposited by sputtering.

Next, in an argon atmosphere, heat treatment is performed at a temperature of 400°–600° C. to form titanium silicide films in the opening and on the surface of the polysilicon film 19. Thereafter, the wafer is removed from the chamber at a removal temperature of 300° C. or below. Then, the free titanium film and the titanium nitride film are removed using a mixed solution of ammonia water or sulfuric acid and hydrogen peroxide. By this, a thin oxygen excess silicide film 11 is formed on the titanium silicide film as shown in FIG. 11(c).

Next, heat treatment required for lowering sheet resistance is performed by using a lamp annealing device to convert the titanium silicide film of the C49 structure to the titanium silicide film 8 of the C54 structure. The heat treatment is performed in an argon atmosphere at a temperature of 800°–900° C. for about 30 seconds. Then, the wafer is removed from the heat treatment chamber at a removal temperature of 300° C. or below to prevent the surface of the silicide from oxidizing.

In this embodiment, the second heat treatment temperature dependence of sheet resistance when the first heat treatment was performed at 500° C. was almost the same as in heat treatment in vacuum (the second embodiment) shown in FIG. 10. In this embodiment also, nitrogen is not incorporated in silicide because silicification was performed in an argon atmosphere. As a result, the phase transition temperature could be lowered by about 30° C. as compared with the first embodiment.

By this third embodiment, since the emitter region 20 is coated by a silicide film of a sheet resistance of 15 Ω/□, the sheet resistance of the polysilicon film 19 for drawing out the emitter is lowered, resulting in the improvement of the circuit operation speed in the bipolar transistor with a large driving current.

Although preferred embodiments are described above, the present invention is not limited to the above embodiments, but various modifications may be performed within the scope of the present invention. For example, in the above described embodiments, silicide films are formed on both the diffusion layer and the gate electrode, but the silicide film may be formed only on one of them. Also in steps shown in FIG. 4(a), FIG. 9(a) and FIG. 11(b), the first heat treatment may be performed after the titanium film 6 is formed followed by the growth of the titanium nitride film.

The present invention is characterized by the removal, and hence exposure to oxygen, of the wafer from the heat treatment chamber at temperatures of 300° C. or below, so as to avoid oxygen incorporation into the silicide film. Therefore, the removal of the wafer from the treatment chamber may be performed above 300° C. as long as the wafer is not exposed to oxygen. For example, the heat treatment chamber may be connected to another processing chamber filled with inert gas or kept under vacuum. The wafer may be transferred to such chambers at temperatures above 300° C. without exposing to oxygen, and cooled or processed therein.

As described above, the method for producing a semiconductor device of the present invention is characterized by the removal of the wafer from the heat treatment chamber at a temperature of 300° C. or below, so as to avoid oxygen exposure at high temperature Therefore, the diffusion of atmospheric oxygen into silicide is prevented, and the thickness of an oxygen excess silicide film within the entire silicide film is reduced. Also according to the present invention, since a thick silicide film which has a low oxygen content may be formed, rise in the phase transition temperature may be prevented, and even if the layer thickness is as thin as several tens of nanometers, a silicide film of a low resistance may be reproducibly formed.

What is claimed is:

1. A method for producing a semiconductor device comprising the steps of:

forming a titanium film on a semiconductor substrate having at least one of a diffusion layer the surface of which is exposed and a polysilicon layer the surface of which is exposed;

forming a titanium silicide layer on at least one layer of said diffusion layer and said polysilicon layer by heating in vacuum in a heat treatment chamber at a temperature in excess of 400° C. to allow the titanium to react with silicon;

inducing phase transition of said titanium silicide layer by heating in a heat treatment chamber to lower resistivity of said titanium silicide; and removing said semiconductor substrate from said heat treatment chamber after said titanium silicide layer has been formed, and exposing said semiconductor substrate to an oxygen-containing atmosphere only after said substrate has cooled to a temperature of 300° C. or below, and wherein a thickness of said titanium silicide layer is less than or equal to 70 nm.

2. A method for producing a semiconductor device comprising the steps of:

forming a titanium film on a semiconductor substrate having at least one of a diffusion layer the surface of which is exposed and a polysilicon layer the surface of which is exposed;

forming a titanium silicide layer on at least one layer of said diffusion layer and said polysilicon layer by heating in an argon atmosphere in a heat treatment chamber at a temperature in excess of 400° C. to allow the titanium to react with silicon;

inducing phase transition of said titanium silicide layer by heating in a heat treatment chamber to lower resistivity of said titanium silicide; and removing said semiconductor substrate from said heat treatment chamber after said titanium silicide layer has been formed, and exposing said semiconductor substrate to an oxygen-containing atmosphere only after said substrate has cooled to a temperature of 300° C. or below, and wherein a thickness of said titanium silicide layer is less than or equal to 70 nm.

3. The method according to claim 2, wherein said step of forming a titanium silicide layer comprises heating at a temperature between 400° and 600° C.

* * * * *